(12) United States Patent
Wan et al.

(10) Patent No.: US 10,695,963 B2
(45) Date of Patent: Jun. 30, 2020

(54) HOUSING, ELECTRONIC DEVICE, AND METHOD FOR MANUFACTURING THE SAME

(71) Applicants: SHENZHEN FUTAIHONG PRECISION INDUSTRY CO., LTD., Shenzhen (CN); FIH (HONG KONG) LIMITED, Kowloon (HK)

(72) Inventors: Guo-Liang Wan, Shenzhen (CN); Yan-Min Wang, Shenzhen (CN); Dian-Hong Wei, Shenzhen (CN)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 0 days.

(21) Appl. No.: 16/234,888

(22) Filed: Dec. 28, 2018

(65) Prior Publication Data
US 2020/0016805 A1 Jan. 16, 2020

(30) Foreign Application Priority Data
Jul. 16, 2018 (CN) .......................... 2018 1 0779291

(51) Int. Cl.
*B29C 45/14* (2006.01)
*H05K 5/04* (2006.01)
(Continued)

(52) U.S. Cl.
CPC ...... *B29C 45/14311* (2013.01); *H05K 5/0017* (2013.01); *H05K 5/04* (2013.01);
(Continued)

(58) Field of Classification Search
CPC .. B29C 45/14311; H05K 5/0017; H05K 5/04; B29K 2705/00; B29K 2101/12; B29L 2031/3481; H04M 1/00
See application file for complete search history.

(56) References Cited

U.S. PATENT DOCUMENTS

| | | | |
|---|---|---|---|
| 8,190,222 B2 * | 5/2012 | Cheng | H04M 1/0202 220/4.02 |
| 2015/0021064 A1 * | 1/2015 | Wang | H05K 5/0243 174/50 |

(Continued)

FOREIGN PATENT DOCUMENTS

| | | |
|---|---|---|
| CN | 204733200 | 10/2015 |
| CN | 207518982 | 6/2018 |
| TW | 201633875 | 9/2016 |

*Primary Examiner* — Abhishek M Rathod
(74) *Attorney, Agent, or Firm* — ScienBiziP, P.C.

(57) ABSTRACT

A housing for an electronic device includes a metal member combined with a plastic member. The combination molds the metal member to the plastic member but the plastic member is discontinuous and recesses and protrusions are cut into the metal member to enable molding and bonding with the plastic member in the manner of a dovetail joint. Manufacture in this way increases bonding strength and reduces the likelihood of internal stresses in the cooling plastic member resulting from complete envelopment of the metal by the plastic. The metal member and the plastic member are thus integrally formed and a thickness of a recess is less than a thickness of the plastic member. An electronic device and a method for making the housing are also provided.

16 Claims, 5 Drawing Sheets

(51) Int. Cl.
*H05K 5/00* (2006.01)
*B29L 31/34* (2006.01)
*B29K 101/12* (2006.01)
*B29K 705/00* (2006.01)

(52) U.S. Cl.
CPC ...... *B29K 2101/12* (2013.01); *B29K 2705/00* (2013.01); *B29L 2031/3481* (2013.01)

(56) References Cited

U.S. PATENT DOCUMENTS

| | | | | |
|---|---|---|---|---|
| 2015/0061476 | A1* | 3/2015 | Ishikura | H05K 5/0004 312/223.1 |
| 2016/0192517 | A1* | 6/2016 | Tsao | H05K 13/00 361/679.01 |
| 2017/0069956 | A1* | 3/2017 | Hill | H01Q 1/243 |

* cited by examiner

| Providing a metal member, the metal member having an outline shape of an electronic device | — 301 |

↓

| Forming a plastic member on an inner wall of the metal member by injection molding, wherein the plastic member comprises at least one recessed portion; a thickness of the at least one recessed portion is less than a thickness of a remaining portion of the plastic member | — 302 |

FIG. 5

HOUSING, ELECTRONIC DEVICE, AND METHOD FOR MANUFACTURING THE SAME

FIELD

The subject matter herein generally relates to a housing, an electronic device, and a method for manufacturing the housing.

BACKGROUND

Electronic devices are becoming lighter and thinner, and appearance of the electronic devices is also important. Therefore, a housing containing the electronic device should have good appearance, good mechanical strength, good heat dissipation, and other features.

The housing can include a metal member and a plastic member. The metal member and the plastic member are combined by insert molding technology wherein the metal member is put into a molding mold, then molten plastic is filled into the molding mold to solidify around the metal. The molten plastic may shrink and deform during a cooling process. The plastic member will have an internal stress due to the shrinking and the deforming, which may affect a quality of the housing.

Therefore, there is room for improvement within the art.

BRIEF DESCRIPTION OF THE DRAWINGS

Implementations of the present disclosure will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 1:
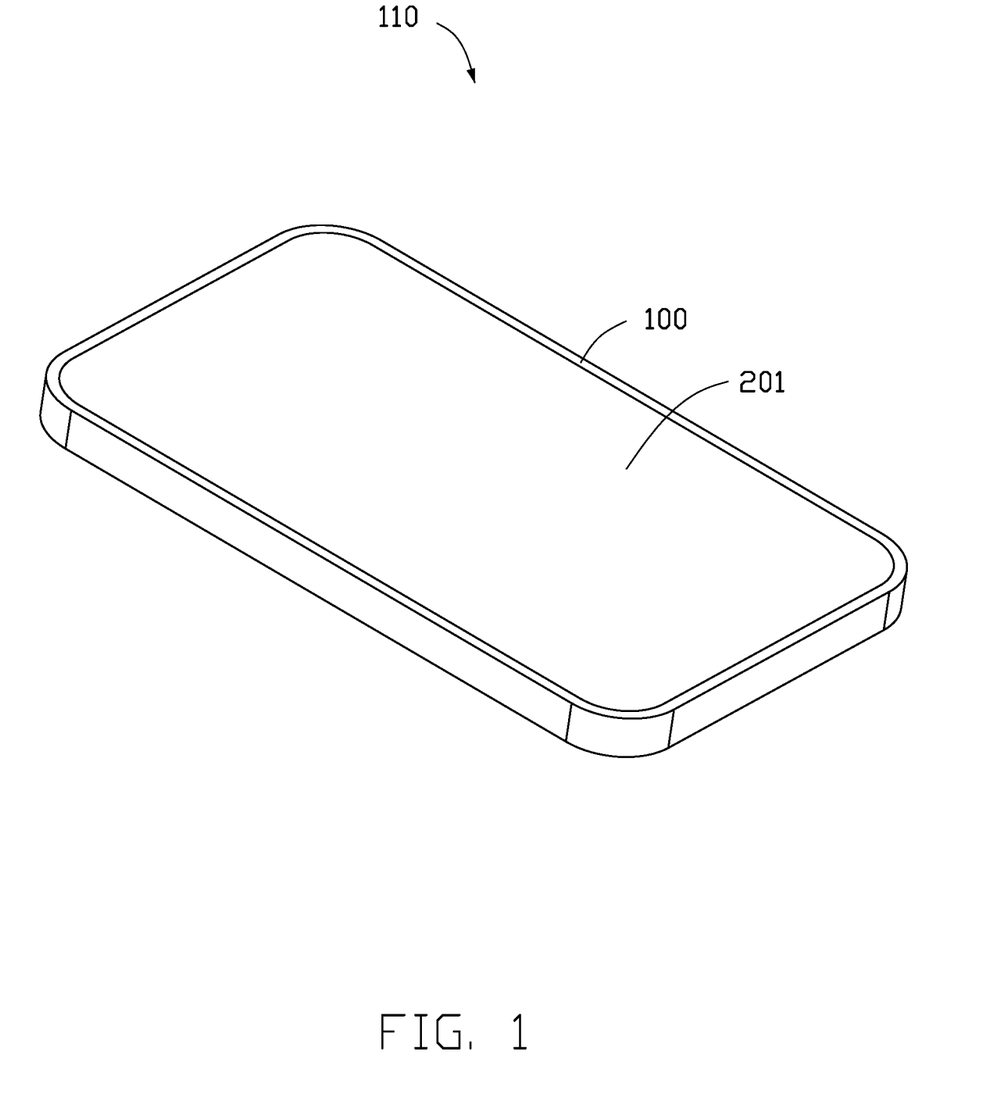
FIG. 1 is an isometric view of a housing for an electronic device in accordance with one embodiment.

FIG. 1 is an embodiment of a housing 100 for an electronic device 110. The electronic device 110 can be a mobile phone, a personal digital assistant, or an MP3 player. The housing 100 and can be a frame of the electronic device 110. The electronic device 110 includes, but is not limited to, the housing 100 and a display 201. The display 201 is detachably mounted in the housing 100. The electronic device 110 can further include, but is not limited to, other mechanical structures, electronic components, modules, and stored software. The display 201 provides an interaction interface. A user can interact with the electronic device 110 through the interaction interface.

Figure 2:
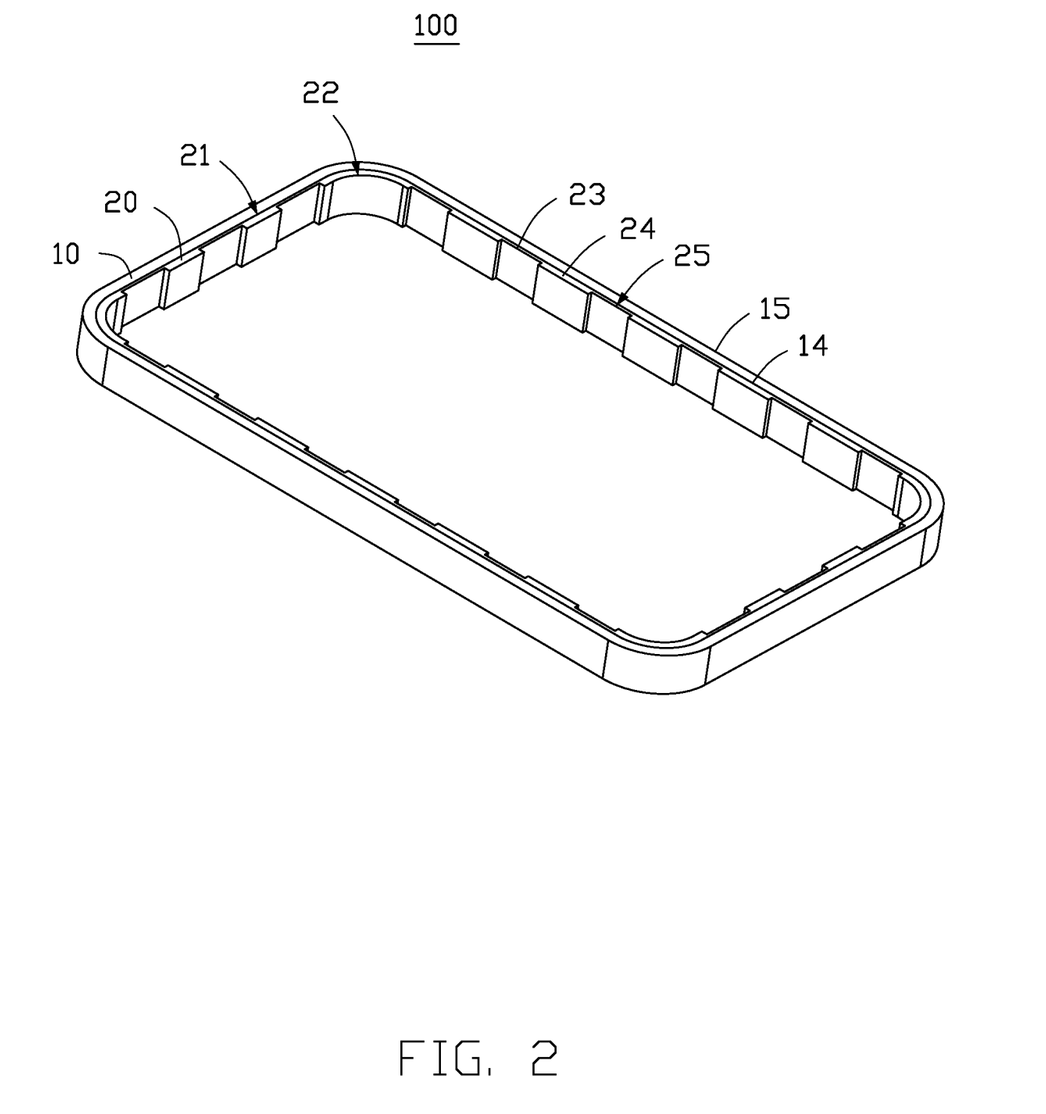
FIG. 2 is an isometric view of a housing of the electronic device of FIG. 1.

Referring to FIG. 2, the housing 100 includes a metal member 10 and a plastic member 20, and the metal member 10 and the plastic member 20 are integrally formed. The metal member 10 is substantially a rectangular frame structure. A thickness of the metal member 10 is substantially uniform. An inner wall 14 of the metal member 10 is a smooth surface. The metal member 10 can be made of a material selected from a group consisting of stainless steel, aluminium, aluminium alloy, magnesium, magnesium alloy, titanium, titanium alloy, copper, and copper alloy or any combination thereof. The metal member 10 can be made by casting, punching, or a computer numerical control (CNC) technology.

The plastic member 20 is substantially a rectangular structure corresponding to the rectangular frame structure of the metal member 10. In other embodiment, the plastic member 20 can be set on a part of the inner wall 14 of the metal member 10 according to demand. That is, the plastic member 20 can be an incomplete or partial rectangular structure. For example, the plastic member 20 can be formed on the inner wall 14 of two long sides of the metal member 10. The plastic member 20 can be formed on the inner wall 14 of two short sides of the metal member 10. The plastic member 20 can be set on part of the inner wall 14 of each side of the metal member 10.

The plastic member 20 includes an outer surface 21 and an inner surface 22 opposite to the outer surface 21. The inner surface 22 of the plastic member 20 includes at least one recessed portion 23, at least one raised portion 24, and at least one opening 25. The recessed portions 23 and the raised portions 24 are arranged alternately. A thickness of the recessed portion 23 is less than a thickness of the raised portion 24. The recessed portion 23 can be formed by recessing from the outer surface 22 toward the inner surface 21. The recessed portion 23 also can be formed by recessing from the inner surface 21 toward the outer surface 22. Correspondingly, each of the recessed portion 23 and two of the raised portions 24 adjacent to each side of the recessed portion 23 can form an opening 25.

As shown in FIG. 2, the recessed portions 23 and the raised portions 24 are arranged alternately along four sides of the inner surface 22. The raised portions 24 are positioned at junctions of the four sides of the inner surface 22. The opening 25 is defined in the inner surface 22. The inner wall 14 of the metal member 10 is bonded to the outer surface 21 of the plastic member 20. The recessed portion 23 is formed by recessing from the inner surface 22 of the plastic member 20 toward the outer surface 21, and the at least one recessed portions 23 and the at least one raised portions 24 are arranged deviating from the inner wall 14 of the metal member 10.

In this embodiment, a material of the plastic member 20 is chosen to be compatible with a material of the metal member 10. The plastic member 20 can be made of a thermoplastic or a thermosetting plastic.

The thermoplastic is selected from a group consisting of polybutylene terephthalate, polyphenylene sulfide, polyethylene terephthalate, polyether ether ketone, polycarbonate, polyvinyl, and chloride polymer.

The thermosetting plastic is selected from a group consisting of polyurethane resin, epoxy resin, and polyurea resin.

A number, a shape, and a size of the protruding portions 33 can be designed according to demand.

In this embodiment, the recessed portions 23 and the raised portions 24 are arranged alternately to make a thickness of the plastic member 20 discontinuous. The plastic member 20 is not continuous so as to reduce an overall shrinking of the plastic member 20 during a molten plastic in a cooling step of an injection molding process, and avoid plastic material of the plastic member 20 affecting the size or structure changing of metal member 10.

Figure 3:
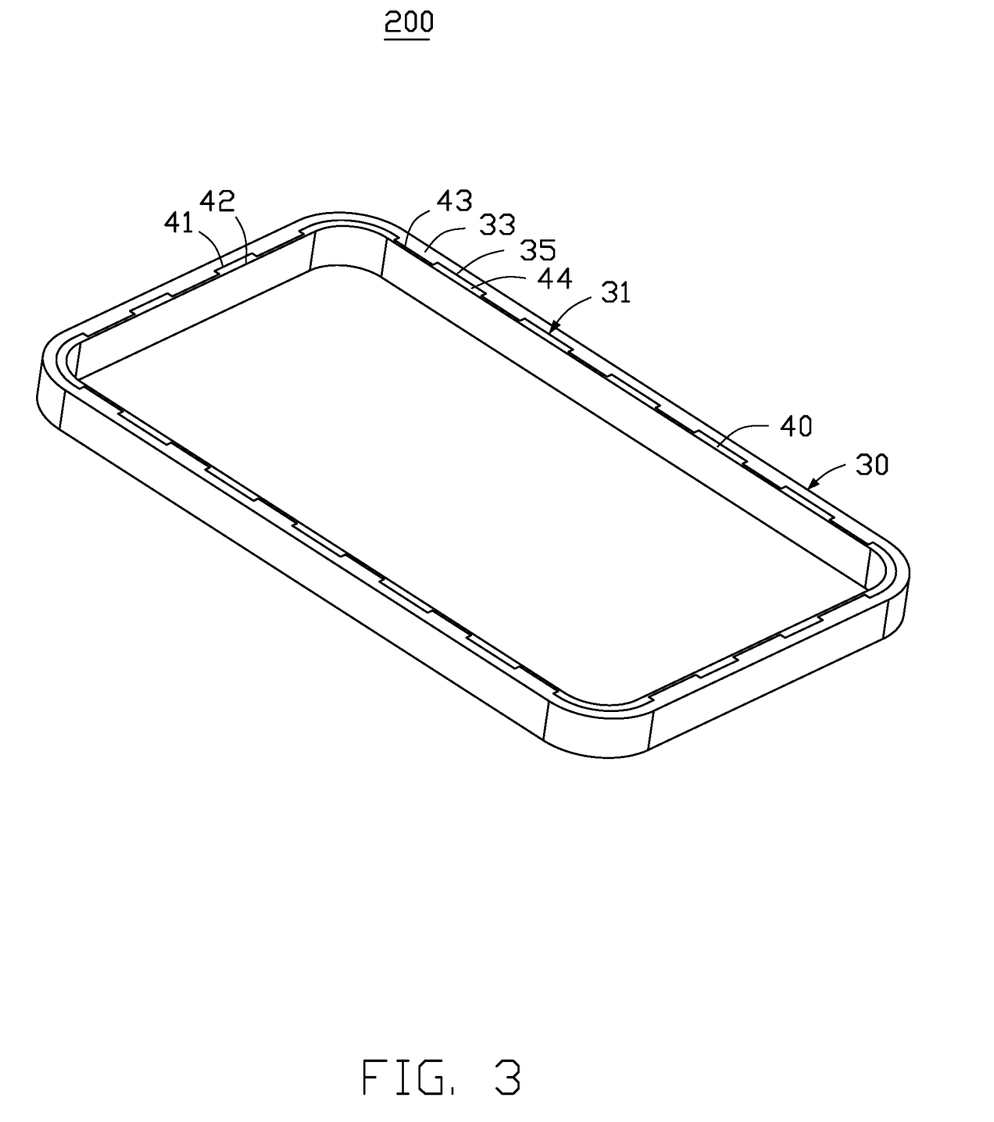
FIG. 3 is an isometric view of a housing in accordance with one embodiment.
Figure 4:
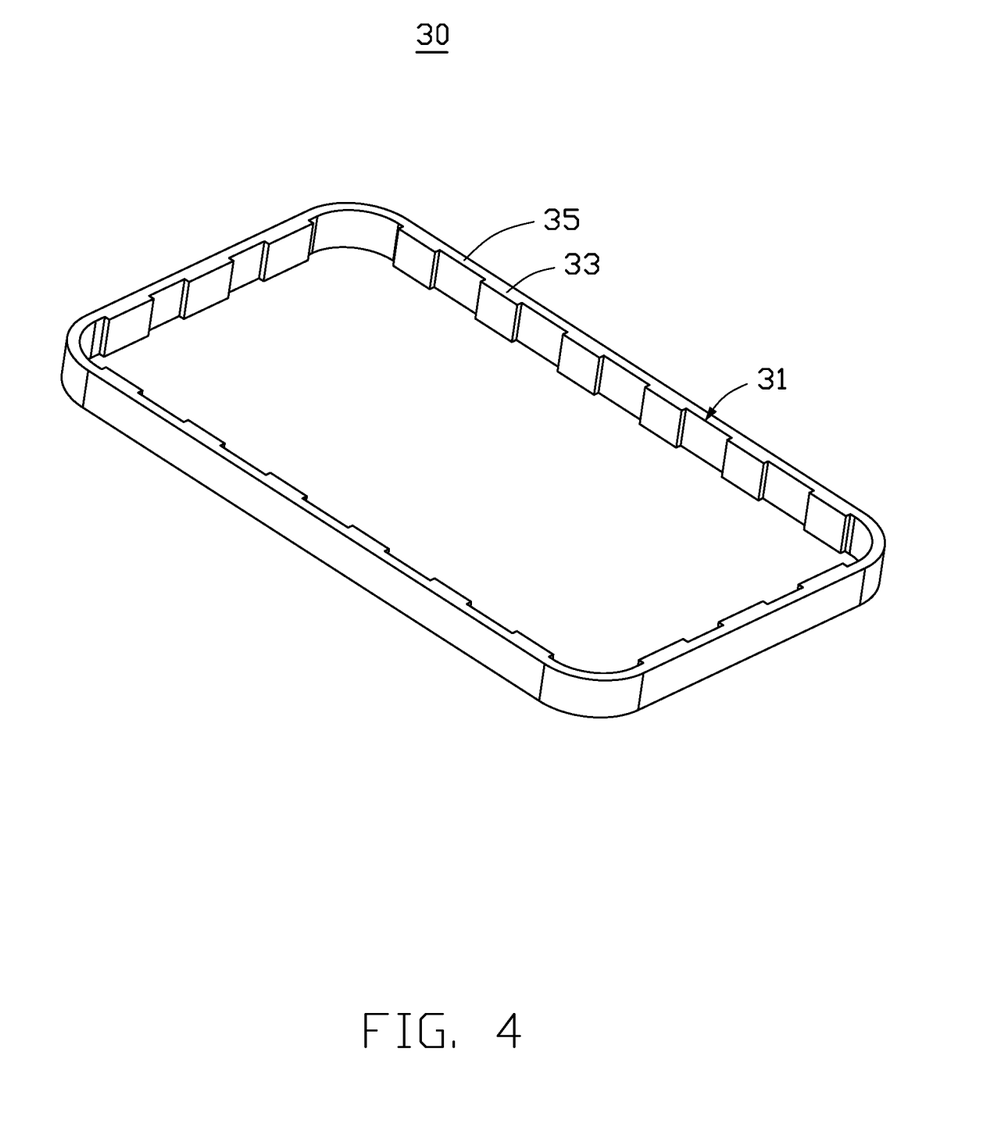
FIG. 4 is an isometric view of a metal member of the housing of FIG. 3.

FIG. 3 and FIG. 4 show a housing 200 according to another embodiment. The housing 200 in FIG. 3 is similar to the housing 100 in FIG. 2. That is, the housing 200 also includes a metal member 30 and a plastic member 40. The difference between the housing 200 and the housing 100 in FIG. 2 is that a structure of the metal member 30 is different from a structure of the metal member 10, and the at least one recessed portion 43 of the plastic member 40 is recessed from the outer surface 41 toward the inner surface 42. The inner wall 31 of the metal member 30 is formed with a plurality of protruding portions 33. Each two adjacent protruding portions 33 define an indent portion 35. That is, the protruding portions 33 and the indent portion 35 are arranged alternately. The protruding portion 33 can be formed by CNC technology.

The at least one recessed portions 43 and the at least one raised portions 44 of the plastic member 40 contact the inner wall 31 of the metal member 30. That is, the protruding portions 33 of the metal member 30 is received and bonded in the recessed portions 43 of the plastic member 40, and the raised portions 44 of the plastic member 40 is received and bonded the indent portion 35 of the metal member 30. In this embodiment, the recessed portions 43 and the raised portions 44 are arranged alternately to make a thickness of the plastic member 40 discontinuous. The plastic member 40 is not continuous so as to reduce an overall shrinking of the plastic member 40 during the molten plastic in a cooling step of an injection molding process, and avoid plastic material of the plastic member 40 affecting the size of metal member 30.

Figure 5:
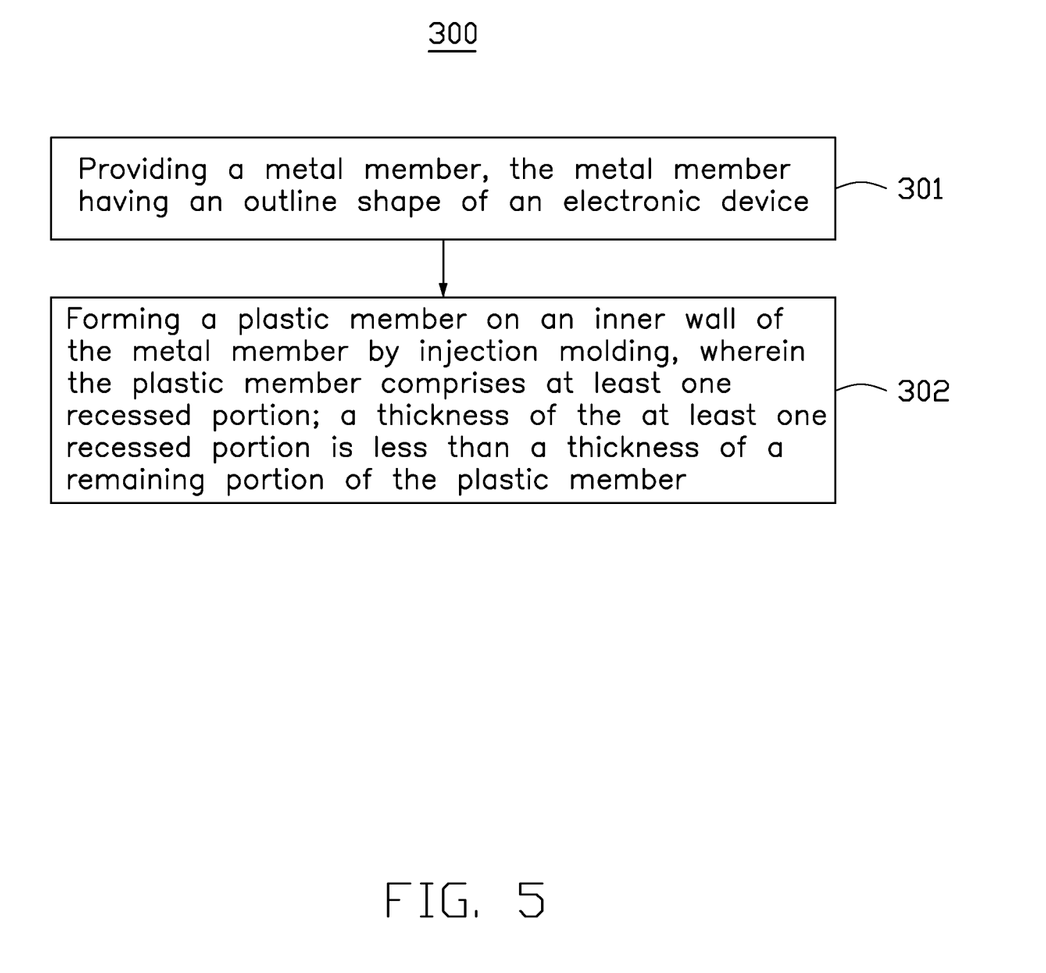
FIG. 5 is a flowchart of a manufacturing method for a housing of FIG. 1.

FIG. 5 illustrate a method for manufacturing a housing 100 according to one embodiment of the present application.

The method 300 is provided by way of example as there are a variety of ways to carry out the method. The method 300 can begin at block 301.

Block 301: a metal member 10 is provided. The metal member 10 has an outline shape of an electronic device 110. The inner wall 14 of the metal member 10 is a smooth surface, and a thickness of the metal member 10 is substantially uniform.

The metal member 10 can be made of a material selected from a group consisting of stainless steel, aluminium, aluminium alloy, magnesium, magnesium alloy, titanium, titanium alloy, copper, and copper alloy or any combination thereof. The metal member 10 can be made by casting, punching, or a CNC technology.

Block 302: a plastic member 20 is formed on the inner wall 14 of the metal member 10 by injection molding. The plastic member 20 includes an outer surface 21 and an inner surface 22. The outer surface 21 is opposite to the inner surface 22.

The plastic member 20 includes at least one recessed portion 23, at least one raised portion 24, and at least one opening 25. The recessed portions 23 and the raised portions 24 are arranged alternately. A thickness of the recessed portion 23 is less than a thickness of the raised portion 24. The recessed portions 23 are formed by recessing from the inner surface 21 toward the outer surface 22. Each of the recessed portion 23 and two of the raised portionss 24 adjacent to the recessed portion 23 can form an opening 25.

The recessed portions 23 and the raised portions 24 are arranged alternately along four sides of the inner surface 22. The protruding portions 24 are positioned at junctions of the four sides of the inner surface 22. The opening 25 is defined in the inner surface 22. Correspondingly, the metal member 10 is bonded to the outer surface 21 of the plastic member 20. The recessed portion 23 is formed by recessing from the inner surface 22 of the plastic member 20 toward the outer surface 21.

Specifically, the metal member 10 is put into a molding mold (not shown). Molten plastic can be filled into the molding mold and cover the inner wall 14 of the metal member 10. After the molten plastic is cooled, the molten plastic may be bonded to the inner wall 14 of the metal member 10 to form the plastic member 20. The recessed portions 23 and the raised portions 24 are arranged alternately to make a thickness of the plastic member 20 discontinuous. The plastic member 20 is not continuous so as to reduce an overall shrinking of the plastic member 20 during the molten plastic in a cooling step of an injection molding process, and avoid plastic material of the plastic member 20 affecting changing the size of metal member 10.

The plastic member 20 can further cover other areas of the metal member 10 to increase a bonding strength between the metal member 10 and the plastic member 20.

The injection molding can be a conventional injection molding technology. The injection molding also can be a nano mold technology (NMT).

When the injection molding is the NMT process, the Block 2 includes: forming a nano-hole (not shown) on the inner wall 14 of the metal member 10 by surface treating the metal member 10. The surface treating can be an electrochemical etching process, a dipping process, an anodic oxidation treatment, or a chemical etching process. After surface treating the metal member 10, the plastic member 20 is formed on the inner wall 14 of the metal member 10 by injection molding.

The plastic member 20 can be made of a thermoplastic or a thermosetting plastic. The thermoplastic is selected from a group consisting of polybutylene terephthalate, polyphenylene sulfide, polyethylene terephthalate, polyether ether ketone, polycarbonate, polyvinyl, and chloride polymer. The thermosetting plastic is selected from a group consisting of polyurethane resin, epoxy resin, polyurea resin or any combination thereof.

A method for manufacturing a housing 200 is similar to method for manufacturing a housing 100. The difference between the method for manufacturing a housing 200 and the method for manufacturing a housing 100 is that providing a metal member 30, a structure of the metal member 30 is different from a structure of the metal member 10, and the at least one recessed portion 43 of the plastic member 40 is recessed from the outer surface 41 toward the inner surface 42. The inner wall 31 of the metal member 30 is formed with a plurality of protruding portions 33. Each two adjacent protruding portions 33 define an indent portion 35. That is, the protruding portions 33 and the indent portion 35 are arranged alternately. The protruding portion 33 can be formed by CNC technology.

And when a plastic member 40 is formed on an inner wall 31 of the metal member 30 by injection molding, the protruding portions 33 of the metal member 30 is received and bonded in the recessed portions 43 of the plastic member 40, and the raised portions 44 of the plastic member 40 is received and bonded the indent portion 35 of the metal member 30.

The embodiments shown and described above. Many details are often found in the art such as the other features of the housing, electronic device, and method for making the housing. Therefore, many such details are neither shown nor described. Even though numerous characteristics and advantages of the present disclosure have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A housing, comprising:
a metal member comprising an inner wall; and
a plastic member, the plastic member comprising;
an outer surface and an inner surface opposite to the outer surface, and the outer surface bonded to the inner wall; and
at least one recessed portion and at least one raised portion, wherein the at least one recessed portion and the at least one raised portion are arranged alternately, the at least one recessed portion is formed by recessing from the inner surface toward the outer surface, and the inner surface of the plastic member is an inner side wall of the housing;
wherein the metal member and the plastic member are integrally formed, a thickness of the at least one recessed portion is less than a thickness of a remaining portion of the plastic member.

2. The housing of claim 1, wherein:
the thickness of the recessed portion is less than a thickness of the raised portion.

3. The housing of claim 2, wherein:
an inner wall of the metal member is a smooth surface.

4. The housing of claim 1, wherein:
the metal member is made of the material selected from a group consisting of stainless steel, aluminium, aluminium alloy, magnesium, magnesium alloy, titanium, titanium alloy, copper and copper alloy.

5. The housing of claim 1, wherein:
the plastic member is made of a thermoplastic or a thermosetting plastic.

6. The housing of claim 5, wherein:
the thermoplastic is selected from a group consisting of polybutylene terephthalate, polyphenylene sulfide, polyethylene terephthalate, polyether ether ketone, polycarbonate, polyvinyl and chloride polymer, the thermosetting plastic is selected from a group consisting of polyurethane resin, epoxy resin, and polyurea resin.

7. The housing of claim 1, wherein:
the metal member is substantially a rectangular frame structure.

8. The housing of claim 7, wherein:
the plastic member is substantially a rectangular structure correspondingly shaped to the rectangular frame structure of the metal member, and the plastic member comprises a plurality of recessed portion and a plurality of raised portion, the recessed portion and the raised portion are formed along four sides of the inner surface alternately.

9. The housing of claim 1, wherein:
the plastic member comprises a top end and a bottom end opposite to the top end, the top end is referred to one end adjacent a display matched with the housing, and the bottom end is referred to one end adjacent to a cover matched with the housing, and the at least one recessed portion extends from the top end to the bottom end.

10. The housing of claim 9, wherein:
the at least one raised portion extends from the top end to the bottom end along a direction of the plastic member.

11. An electronic device, comprising:
a display screen; and
a housing comprising:
a metal member comprising an inner wall; and
a plastic member comprising:
an outer surface and an inner surface opposite to the outer surface, and the outer surface bonded to the inner wall; and
at least one recessed portion and at least one raised portion, wherein the at least one recessed portion and the at least one raised portion are arranged alternately, the at least one recessed portion is formed by recessing from the inner surface toward the outer surface, and the inner surface of the plastic member is an inner side wall of the housing;
wherein the display screen is detachably mounted in the housing, the metal member and the plastic member are integrally formed, a thickness of the at least one recessed portion is less than a thickness of a remaining portion of the plastic member.

12. The electronic device of claim 11, wherein:
an inner wall of the metal member is a smooth surface, and the at least one recessed portions and the at least one raised portions are arranged deviating from the inner wall of the metal member.

13. The electronic device of claim 11, wherein:
the metal member is substantially a rectangular frame structure.

14. The electronic device of claim 13, wherein:
the plastic member is substantially a rectangular structure correspondingly shaped to the rectangular frame structure of the metal member, and the plastic member comprises a plurality of recessed portion and a plurality of raised portion, the recessed portion and the raised portion are formed along four sides of the inner surface alternately.

15. The electronic device of claim 11, wherein:
the plastic member comprises a top end and a bottom end opposite to the top end, the top end is referred to one end adjacent a display matched with the housing, and the bottom end is referred to one end adjacent to a cover matched with the housing, and the at least one recessed portion extends from the top end to the bottom end.

16. The electronic device of claim 15, wherein:
the at least one raised portion extends from the top end to the bottom end.

* * * * *